(12) United States Patent
Choy et al.

(10) Patent No.: US 10,815,121 B2
(45) Date of Patent: Oct. 27, 2020

(54) COMPOSITE WAFERS

(71) Applicant: HEWLETT-PACKARD DEVELOPMENT COMPANY, L.P., Spring, TX (US)

(72) Inventors: Si-lam J. Choy, Corvallis, OR (US); Chien-Hua Chen, Corvallis, OR (US); Michael W. Cumbie, Corvallis, OR (US); Devin Alexander Mourey, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/099,020

(22) PCT Filed: Jul. 12, 2016

(86) PCT No.: PCT/US2016/041878
§ 371 (c)(1),
(2) Date: Nov. 5, 2018

(87) PCT Pub. No.: WO2018/013086
PCT Pub. Date: Jan. 18, 2018

(65) Prior Publication Data
US 2019/0135615 A1    May 9, 2019

(51) Int. Cl.
*H01L 23/18* (2006.01)
*B81B 7/00* (2006.01)
*B81C 1/00* (2006.01)
*H01L 23/00* (2006.01)
*H01L 21/56* (2006.01)
(Continued)

(52) U.S. Cl.
CPC .......... *B81B 7/0077* (2013.01); *B81C 1/0023* (2013.01); *H01L 21/568* (2013.01); *H01L 23/18* (2013.01); *H01L 23/293* (2013.01); *H01L 23/3107* (2013.01); *H01L 24/00* (2013.01); *H01L 24/96* (2013.01); *B81B 2201/058* (2013.01); *H01L 2224/96* (2013.01);
(Continued)

(58) Field of Classification Search
CPC ...................................................... H01L 21/56
See application file for complete search history.

(56) References Cited

U.S. PATENT DOCUMENTS

| 3,854,946 A | 12/1974 | Ulrich et al. |
| 4,285,433 A | 8/1981 | Garrett, Sr. et al. |

(Continued)

FOREIGN PATENT DOCUMENTS

| TW | 200707528 A | 2/2007 |
| WO | WO-03036672 | 5/2003 |

OTHER PUBLICATIONS

Shillinger; "Overview of Wafer Level Packaging Technology for Mems Applications"; Nov. 18, 2010; http://www.memsjournal.com/2010/11/overview-of-wafer-level-packaging-tech.
(cont. from above) http://www.memsjournal.com/2010/11/overview-of-wafer-level-packaging-technology-for-mems-applications-1.html.

* cited by examiner

*Primary Examiner* — Thao P Le
(74) *Attorney, Agent, or Firm* — Michael A. Dryja (57) ABSTRACT

A composite wafer includes a first silicon die with a first top surface; and a polymer substrate with a top surface and a bottom surface. The silicon die is embedded in the polymer substrate such that the top surface of the substrate and the first top surface of the first silicon die are coplanar and the bottom surface of the polymer substrate is planar.

13 Claims, 5 Drawing Sheets

(51) Int. Cl.
*H01L 23/31* (2006.01)
*H01L 23/29* (2006.01)

(52) U.S. Cl.
CPC ............ *H01L 2924/10253* (2013.01); *H01L 2924/1461* (2013.01)

(56) References Cited

U.S. PATENT DOCUMENTS

| | | | |
|---|---|---|---|
| 5,888,884 A * | 3/1999 | Wojnarowski | H01L 24/13 438/462 |
| 7,459,774 B2 | 12/2008 | Kwon et al. | |
| 7,500,610 B1 * | 3/2009 | Hadley | G06K 19/07718 235/451 |
| 8,609,471 B2 | 12/2013 | Xu | |
| 9,087,973 B1 * | 7/2015 | Perez-Bolivar | H01L 33/62 |
| 9,101,929 B2 * | 8/2015 | Ehrenpfordt | B01L 3/5027 |
| 9,152,905 B2 * | 10/2015 | Herold | B01J 19/0046 |
| 2003/0153119 A1 * | 8/2003 | Nathan | H01L 21/56 438/106 |
| 2004/0113283 A1 * | 6/2004 | Farnworth | H01L 21/3043 257/782 |
| 2007/0105339 A1 | 5/2007 | Faris | |
| 2011/0169159 A1 | 7/2011 | Lin et al. | |
| 2013/0250532 A1 | 9/2013 | Bryzek | |
| 2014/0083858 A1 | 3/2014 | Teh et al. | |
| 2014/0110859 A1 * | 4/2014 | Rafferty | H01L 23/4985 257/774 |
| 2014/0183719 A1 | 7/2014 | Simmons-Matthews | |
| 2015/0001730 A1 * | 1/2015 | Raorane | H01L 21/486 257/773 |
| 2015/0279789 A1 * | 10/2015 | Mahajan | H01L 23/552 257/659 |
| 2015/0279814 A1 * | 10/2015 | Hurwitz | H01L 23/481 257/774 |
| 2019/0189564 A1 * | 6/2019 | Guzek | H01L 23/13 |

//  COMPOSITE WAFERS

BACKGROUND

Semiconductor devices including integrated circuits, microfluidic devices, and MEMS (microelectromechanical systems) continue to shrink in size. This continued size reduction may be associated with reduced material costs and reduced costs per device as more devices are produced in a given set of operations on a silicon wafer of a given size.

BRIEF DESCRIPTION OF THE DRAWINGS

The accompanying drawings illustrate various examples of the principles described herein and are a part of the specification. The illustrated examples do not limit the scope of the claims. Throughout the drawings, identical reference numbers designate similar, but not necessarily identical, elements.

DETAILED DESCRIPTION

For purposes of this specification and the associated claims, composite as in composite wafer should be understood as a wafer formed from two or more different materials. In one example, a composite wafer comprises a die, for example a silicon die, embedded within a polymer body such that the composite wafer has a planar top surface which allows additional wafer processing to be performed. In a second example, a composite wafer includes silicon die and a non-silicon die embedded within a polymer body. In a third example, a composite wafer includes silicon die embedded in a polymer body where the polymer body also has other materials, such as a conduit, tube, or conductor, embedded within the wafer.

The term die is both singular and plural, with dice and dies as recognized plural forms. Thus, die may refer to a single die or to multiple die. As used in this specification and associate claims, die does not mandate multiple die unless the context specifically indicates. In most cases, the term die includes a single die and allows for multiple die. Although the drawings may show one or a small number of die in some of the figures, this disclosure clearly envisions applying the disclosed techniques to any number and combinations of die and similar components (other than zero). While strictly speaking, a die is sometimes understood as a portion on a semiconductor, as used in the specification the term die also includes components of electronic devices, microelectromechanical systems (MEMS), and microfluidic devices that are assembled on substrates that include polymers, composites, glasses, and ceramics. These components are then integrated into a composite wafer by forming a polymer body around them. Accordingly, unless preceded by the modifier silicon, the term die should be understood to encompass components on any suitable substrate.

The continued march of Moore's law has been associated with continued and ongoing reduction in size for electronic components. As fabricated electronic components continue to shrink in size, providing signals, information, current, and fluids to and from increasing smaller devices has an ongoing challenge. In some instances, device footprints do not decrease in size due to the need to provide input and receive output from the components. Further, the increasingly small transistors and other elements that enable the increases in memory density and processing power have allowed other technologies to use the same techniques to produce a wide variety of useful products. For example, MEMS (microelectromechanical systems) combine electronic components and small scale mechanical devices. Microfluidics covers evaluation of small volumes of fluid and includes pretreating the fluid prior to evaluation. As devices are made smaller and smaller, there is continued benefit to shrinking the size of the device fabricated on the silicon wafer in order to produce a maximum number of components on a silicon wafer of a given size.

Further, the cost of the silicon wafer remains a significant part of the cost of the fabricated devices. This is due, in part, to the difficulty of fabricating large, high quality silicon crystals capable of providing the desired functionality. Large single crystal silicon is grown under painstaking conditions to avoid inclusion of defects and contaminants (see, e.g., the Czochralski process). The wafers are then formed by cutting the crystals into flat disks which are polished to provide a desired flatness. Other materials besides silicon have seen increasing use in electronics, MEMS, and microfluidics devices. However, so far, other materials have not been able to replace the functionality of silicon in providing high resolution fabrication and functionality for many applications. Despite the associated costs, silicon wafers remain the basis for most semiconductor fabrication.

Accordingly, there are been efforts made to substitute other materials for silicon in the fabrication of integrated circuits, MEMS, and microfluidic devices. These efforts have had some successes. However, monocrystalline silicon substrates continue to provide significant advantages in many designs leading to their continued use over other, cheaper materials.

The present disclosure combines the functionality of silicon (including monocrystalline silicon) substrates with the cost benefits of other materials by forming a wafer of polymeric material around a silicon die. The silicon die provide the desired the high functionality of silicon based substrates for the relevant portions of the design. However, where the material properties of the substrate have less impact, the use of polymer provides a reduction in cost. This approach also allows in the incorporation of die with different processing histories, for example, the use of both CMOS pullup and pulldown networks without having to perform both sets of manufacturing operations on the same silicon die with the associated fallout and cost issues. Similarly, molded microfluidic components, etched MEMS components, and integrated circuits can all be combined in a common substrate to allow efficient manufacture and assembly of devices.

The components are integrated into the polymer substrate to form a flat topped composite wafer. The wafer can be processed using existing semiconductor fabrication techniques to provide electrical connections between components, fluidic connections, and/or additional functional layers and elements. Individual components can also be quality tested after removal from their original die or manufacturing processes and prior to integration into the composite wafer.

Finally, the provision of routing and electrical contacts by subsequent layers applied to the composite wafer, allow the minimization of the silicon die size. This, in turn, allows more die to be formed from a given silicon wafer and further reduces the cost of the components used in the composite wafer. This approach also provides layout flexibility and provides additional efficiencies in laying out subcomponent die on the silicon wafer.

Accordingly, the present specification describes, among other examples, a composite wafer, the wafer includes: a first silicon die with a top surface; and a polymer substrate with a top surface and a bottom surface, the silicon die embedded in the polymer substrate such that the top surface of the substrate and the first top surface of the first silicon die are coplanar and the bottom surface of the polymer substrate is planar.

Accordingly, the present specification describes, among other examples, a method of forming a composite die. The method includes: applying a tape to a first surface of a silicon die; forming a polymer substrate around the silicon die, the polymer substrate have a first surface coplanar with the first surface of the silicon die; and removing the tape from the first surface of the silicon die.

The present specification also describes a composite wafer for fabricating devices. The composite wafer includes: a first silicon die including a component of a microfluidics device; a second silicon die including an integrated circuit; and a polymer packaging with a flat bottom surface, wherein the first silicon die, second silicon die, and the polymer package form a coplanar top surface.

Figure 1:
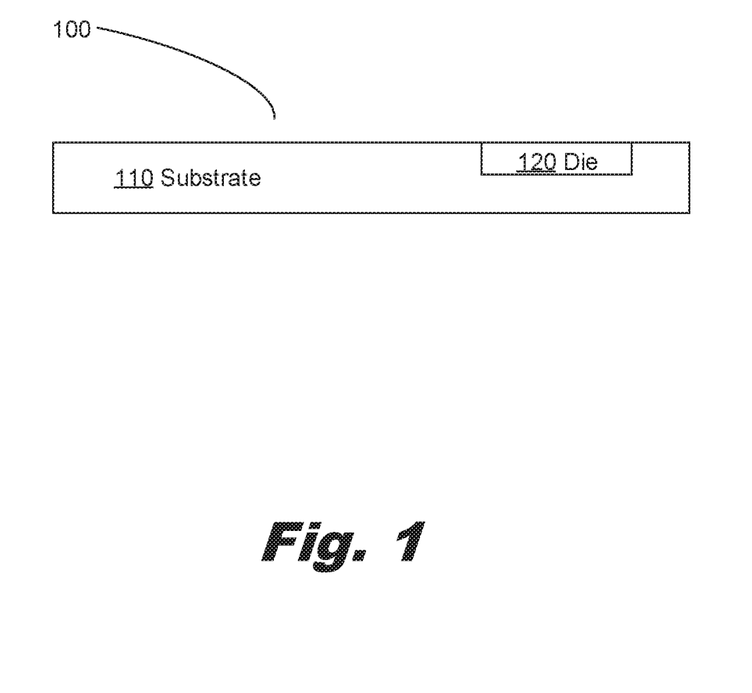
FIG. 1 shows a profile view of a wafer according to one example consistent with the present disclosure.

Turning now to the drawings. FIG. 1 shows a profile view of a wafer according to one example consistent with the present disclosure. The wafer (100) comprises the substrate (110) and the die (120). The substrate (110) has a planar bottom surface. The substrate (110) and the die (120) form a coplanar top surface for the wafer (100).

The wafer (100) provides a form that facilitates secondary processing. Many well established and reliable semiconductor fabrication processes are designed and optimized around deposition onto a flat wafer (100). These processes have undergone extensive development to provide high reliability when forming small features. While some semiconductor fabrication processes can be performed on non-flat surfaces the results generally have increased variation and reduced yields. The wafer (100) has a flat top surface that includes a top surface of the die (120). The wafer (100) has a flat bottom surface. The separation of the top and bottom surfaces of the wafer (100) can be selected based on other design parameters including handling robustness. The formation of a constant thickness wafer (100) allows die (120) of different thickness to be integrated into a common wafer (100) and processed together without introducing height variation and the associated process variation. Integration in a composite wafer (100) also allows functional testing or quality control of the die (120) prior to integration into the wafer (100). Testing avoids the waste of continuing to process defective die (120).

The term wafer (100) should be understood has having a coplanar top surface with a portion of a die forming part of the top surface and a planar bottom surface. The plan view can be any shape, for example, circular, square, rectangular, or a custom shape to accommodate the die (120) or the final device design. The top and bottom surfaces may be parallel. The thickness can be thin and on the order of a die thickness or may be thicker with the wafer (100) resembling a puck. The lower cost of the polymer material compared with silicon allows the use of thicker wafers (100) without significant increases in cost. Thus, the thickness may be increased to enhance handling or adjust the size of the final device. In some examples, the composite wafer (100) is a thin circular disk of uniform thickness.

The substrate (110) is formed around the die (120) to provide a common coplanar top surface of the wafer (100) that includes the substrate (110) and the die (120). The substrate (110) may be formed by casting the substrate (110). For example, the die (120) may be positioned on a tape or sheet material with an adhesive. The substrate (110) may then be cast over the die (120). Once the substrate (110) has cured, the tape or sheet may be removed to provide the coplanar top surface of the wafer (100). In another example, the substrate (110) may be compression molded around the die (120). In a third example, the substrate (110) may be injection molded around the die (120).

The substrate (110) is a material that is capable of being formed around the die (120) to provide a coplanar top surface of the wafer (100). In some examples, the substrate (110) is a polymer. The substrate (110) may be a thermoplastic, for example: acrylic (PMMA), ABS, polysulfone (PS), polyetherimide (PEI), polycarbonate (PC), polystyrene (PC), polyethylene (PE, HOPE, LOPE), polypropylene (PP), polyimide (e.g. Nylon), polyether ether ketone (PEEK), polyvinyl chloride (PVC), and similar materials including specialty polymers. The substrate (110) may be a thermoset polymer, for example: epoxy, silicone, polyimides, polyester, polyurethane, bakelite, duroplast, diallyl-phthalate (DAP), cyanate esters, melamine, and similar substances including specialty polymers. The substrate (110) may be a composite that includes silica, glass, clay, mineral, or oxide reinforcement. Composites may provide additional desirable material properties or further reduce costs.

The die (120) includes a component. The component can be a microfluidic component, a MEMS component, an integrated circuit, a pull down or pullup CMOS network, or similar element. The die (120) may be silicon. The die (120) may alternately be glass, plastic, ceramic, composite, or another material used to form and support components. In one example, the die (120) is a silicon die (120) with a microfluidic component. Silicon has many advantages in forming electronic, MEMS, and microfluidic components, including excellent material properties, the ability to selectively modify the properties by doping, established processes with high reliability, etc. Silicon is also a relatively expensive substrate material compared with polymers and glass. By using silicon material to form some components and then embedding the silicon die in a composite wafer, the present disclosure is able to achieve high performance at lower unit costs. In other examples, the composite wafer may include die that use a variety of substrates with each substrate selected to suit the manufacture of the specific die. Similarly, the selected die may be manufactured using different processes or process steps. The various die are then combined in a composite wafer, allowing additional processing such as electrical routing or fluid distribution to be applied to the selected multiple die. The radiation sensitive polymer applied after forming the composite wafer may facilitate tasks like fluid routing, allowing them to be performed in lower cost materials and minimize the size of the die, including any silicon die. Similarly, the ability to mix and match the die and the die processing allows the use of common intermediate components may reduce the number process steps needed to produce the die, may increase the variety of components and processes that can be integrated into a final device, and may reduce costs.

In one example multiple composite wafers (100) are assembled surface to surface to form a three dimensional device. The use of standardized thicknesses to the composite wafers (100) facilitates modularity to such designs. The composite wafers (100) may include standardized ports or connections between wafers to accommodate voltage, ground, and fluids (either liquids or gases). The composite wafers may include connections or junctions to facilitate alignment or connection of the composite wafers (100).

Figure 2:
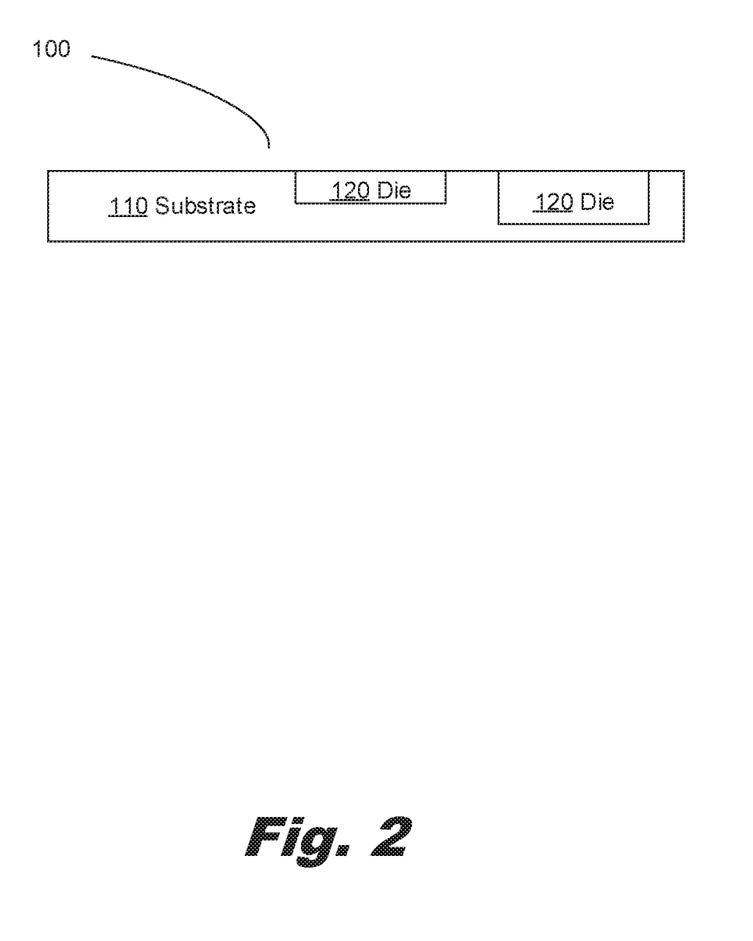
FIG. 2 shows a profile view of a wafer accordingly to one example consistent with the present disclosure.

FIG. 2 shows a profile view of a wafer (100) according to one example consistent with the present disclosure. The wafer (100) comprises the substrate (110) and multiple die (120). The die (120) may be of different thicknesses. The die (120) and the substrate (110) form a coplanar top surface. The substrate has a planar bottom surface.

One significant advantage in forming a composite wafer (100) is the ability to mix and match the die (120) and the associated components. In systems formed on a single wafer (100), for example, traditional semiconductor fabrication, the inclusion of additional process operations is associated with significant costs due to cumulative fallout and the expensive substrate material. For example, include both pulldown and pullup networks on a silicon substrate is generally avoided due to the increased number of process operations required. Similarly, forming deep features via milling, etching, or other processes may likewise be inefficient or costly. Similarly, a traditional wafer (100) has an effectively uniform functional thickness with all portions of the traditional wafer (100) being built up with each process operations. Thus, all components on the traditional wafer (100) are subject to and in the work area for all manufacturing operations conducted on any component of the traditional wafer (100). This can result in additional masking/demasking operations and inefficient space use on the wafer (100). Components that form defects at an early manufacturing operation still occupy process space until the wafer is completed and diced, reducing efficiency. Finally, components are traditionally built up on one surface of a wafer (100). Building components on both sides of the wafer (100) has the same fallout and cost effectiveness issues discussed above.

In contrast, forming a composite wafer (100) after the components have been formed using an optimal amount of initial processing may reduce continued processing of defective parts. This mix and match approach to components and die allows the combination of very different processes and substrates in individual die (120) onto a common composite wafer (100). The composite wafer (100) can be formed with functional elements on the top and bottom surfaces. Vias and fluid channels can be connected between both sides of a composite wafer (100) facilitating fluid transfer. For example, inclusion of a via for current in traditional multilevel fabrication can include etching out the via and then depositing a conductive material in the via. In contrast, in order to electrically connect the two sides of a composite wafer, a conductive metal rod or prefabricated component can be cast or molded in place. After the rod via is in place, the electrical connections to the via can be formed as part of connecting the die on the composite wafer (100). Similarly, fluidic connections between sides can be formed with preformed parts and/or tubing and then connected in as part of forming the routing on the composite wafer (100).

One method for forming a composite wafer (100) with exposed die (120) on the top and bottom surfaces is to place some of the die (120) on blocks or scaffolding to hold the die (120) in place that are not on a surface with a tape. In one example, the scaffold is a molded component that is overmolded as part of the composite wafer (100) forming process. The scaffold may include holes or gaps to facilitate overmolding by the polymer substrate (110). The scaffold may contact dies on points or in a portion of the area of the die to facilitate contact between the polymer substrate (110) and the die (120). The overmolding converts the scaffold and die (120) into a unified composite wafer (100) capable of being further processed.

Figure 3:
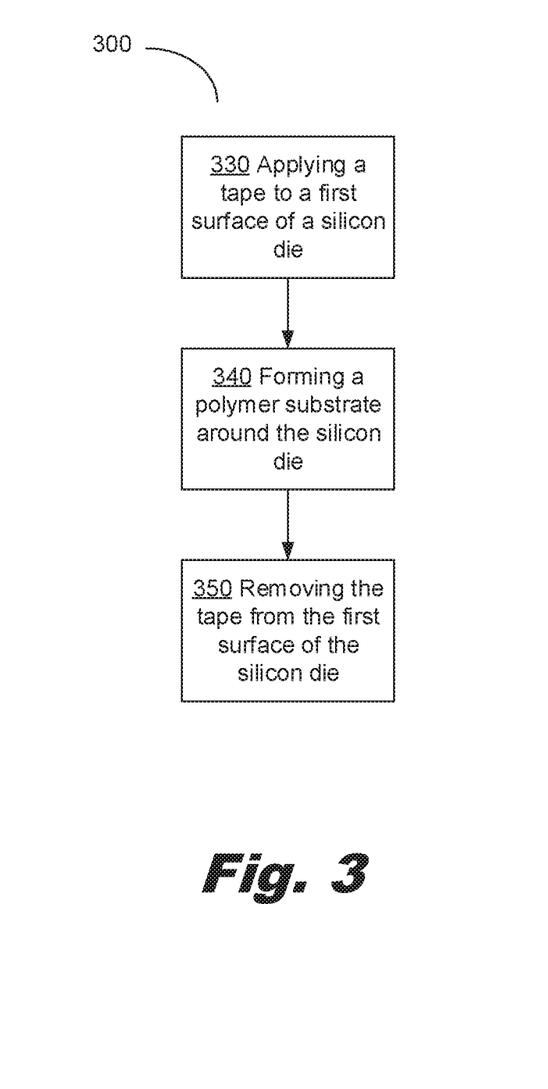
FIG. 3 outlines a method according to one example consistent with the present disclosure.

FIG. 3 outlines a method (300) according to one example consistent with the present disclosure. The method (300) comprises: applying a tape to a first surface of a silicon die (330); forming a polymer substrate around the silicon die, the polymer substrate having a first surface coplanar with the first surface of the silicon die (340); and removing the tape from the first surface of the silicon die (350).

Operation 330 is applying a tape to a first surface of a silicon die (310). As used in the context of this specification and the associated claims, a tape is a sheet material with an adhesive on one side or both sides. A tape does not need to be narrow, indeed for many of the instances, a tape that is roughly square or circular may provide a benefit. The adhesive on the tape is preferably a pressure sensitive adhesive that can be applied and subsequently readily removed. Removal of the tape can also be performed chemically, mechanically and/or thermally. In another example, thermal release tape can also be used which has pressure sensitive adhesive on one side and thermal release adhesive on the other side.

The tape is applied to one surface of the die (120). This surface will be coplanar with the polymer substrate (110) after formation of the polymer substrate (110). The tape helps prevent infiltration of the die by polymer during forming of the polymer substrate (110). Multiple die (120) can be placed on a common tape. In one example, the die (120) are loaded into a fixture, the tape is applied onto the top of the die (120) in the fixture, the assembly is then inverted and the fixture removed. There may be a predetermined gap between the fixture and the applied tape to avoid adhesion between the tape and the fixture. The fixture may include texturing to reduce the contact area between the fixture and the tape. The sheet on the tape may be rigid or semi rigid to facilitate inversion and forming a uniform top on the composite wafer (100). Alternately, a rigid body; such as a tray or plate, may be placed against the back of the tape to facilitate inversion and prevent distortion when forming the polymer substrate (110).

Operation 340 is forming a polymer substrate (110) around the silicon die (110), the polymer substrate (110) having a first surface coplanar with the first surface of the silicon die (120). The polymer substrate (110) may be formed by casting, for example, using an epoxy. The polymer substrate (110) may be formed by molding, for example, by compression molding using a thermoplastic. The polymer substrate (110) fills in around the die (120) and any scaffolding or other materials to form the composite wafer (100) with a coplanar top surface with a die (120) surface being a portion of the coplanar top surface. The composite wafer (100) also has a planar bottom surface. In one example, the bottom surface is formed as part of forming the polymer substrate (110). In a second example, the bottom surface is formed as part of a secondary operation, for example, polishing, in order to provide the desired smoothness and levelness to the composite wafer (100). In a third example, the bottom surface of the composite wafer (100) includes a number of recesses or holes that allow the composite wafer (100) to be rigidly held in place relative to fixturing. The composite wafer (100) may be roughly circular but include features on the edge that allow for fixturing to hold the wafer in place, for example, flat portions on opposite edges, notches, indents, and/or tabs to make contact. These features may be symmetrically distributed so as to facilitate spin coating and similar processes while still enabling fixturing of the composite wafer. The composite wafer (100) is preferably compatible with existing wafer processing equipment. However, the composite wafer (100) does not have the same inherent shape limitations of traditional silicon wafers (100). Accordingly, many shape variations are possible for composite wafers (100).

Operation 350 is removing the tape from the first surface of the silicon die (120). Removing the tape and the associated adhesive allow the surface of the silicon die (120) to receive secondary operations as part of the surface of the composite wafer (100).

For example, depositing a radiation sensitive polymer, and patterning the radiation polymer with a selective cure operation can be used to form fluid routing between different die (120) of the wafer (100). In one example, selective cure is performed by using a mask to subject parts of a radiation sensitive polymer to radiation while shielding other portions of the radiation sensitive polymer. The unreacted portions of the polymer can then be removed to produce a patterned layer of polymer material on the wafer. This patterned layer may include fluid routing and other features. This approach permits the fluid handing features to extend beyond the footprint of silicon die (120), reducing the size of the silicon die (120). As a result, in this example the silicon die (120) does not need to support much fan out and fluid routing. Similarly, electrical connections to support the various die (120) can be patterned onto the composite wafer (100) using existing techniques.

Figure 4:
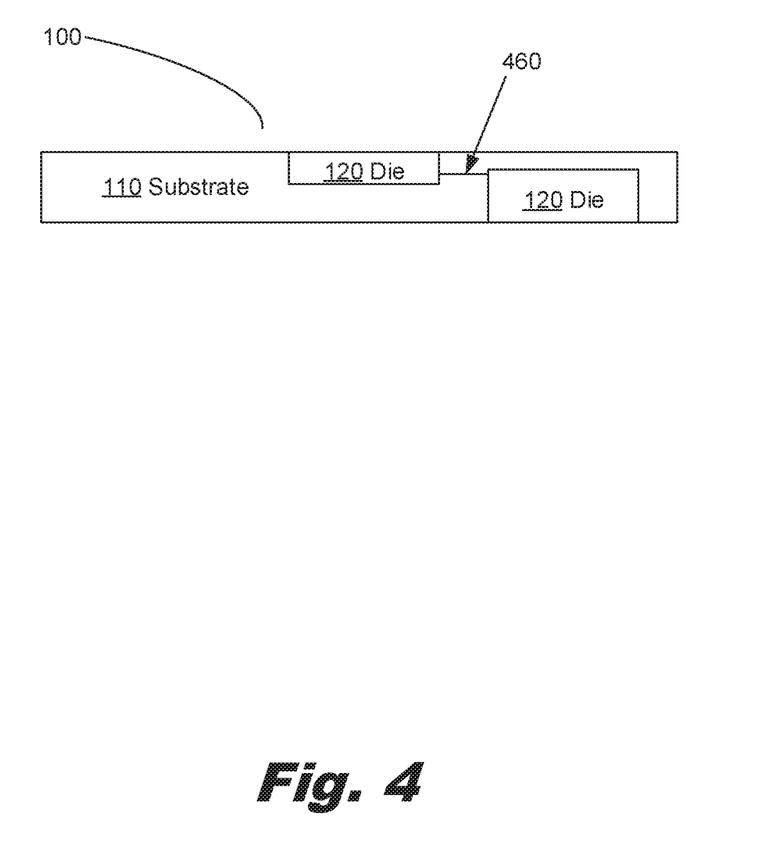
FIG. 4 shows a profile view of a wafer according to one example consistent with the present disclosure.

FIG. 4 shows a profile view of a wafer (100) according to one example consistent with the present disclosure. The die (120) are mounted with exposed surfaces on opposite sides of the wafer (100). FIG. 4 also shows an electrical connection (460) between the die (120) through the substrate (110). In some examples, the electrical connections (460) are formed prior to forming the substrate (110). For example, an electrical connection (460) may be soldered in place and then the substrate (110) is cast or over molded to form the composite wafer (100).

The term wafer (100) is used to indicate compatibility with the footprint and processes used in semiconductor fabrication of silicon wafers (100), the term wafer (100) as used in the specification and associated claims does not indicate thinness in the height of the wafer (100). While silicon wafers (100) are generally between 0.2 and 1.0 mm thick in order to reduce material costs, the composite wafers (100) may be between 0.1 and 15 mm in thickness. In some instances, the composite wafers (100) are 0.8 to 2.5 mm in thickness. For example, a composite wafer (100) may be approximately 1 mm in thickness. The composite wafer (100) thickness may be extended as thick as desired. However, there are decreasing returns to increasing thickness and eventually the cost and incompatibility with existing wafer (100) processes make additional thickness less desirable. The composite wafer (100) may be circular. However, other shapes are possible, including squares, rectangles, ovals, and more complex shapes designed to better fit the layout of processing equipment. One advantage of substituting a polymer in place of the expensive silicon substrate is the ability to increase the thickness of the composite wafer (100) to provide robustness to handling without drastically increasing the material cost.

While silicon wafers (100) are generally circular due to the radial symmetry of crystal growth, the composite wafers (100) can incorporate features to aid handling or fixturing during subsequent operations. In one example, these features are holes to receive posts in a surface of the composite water (100). In a second example, these features are indents or projections around the edge of the wafer (100) to facilitate fixturing. In a third example, these features are flat sides on opposite edges of the wafer (100) to facilitate fixturing and/or handling. The wafer (100) shape may be symmetrical in order to facilitate spin coating and other operations.

Some manufacturing operations use a wafer (100) carrier to support and protect silicon wafers (100). In contrast, a composite wafer (100) may be suitably protected from damage without a wafer (100) carrier. In one example, the composite wafer (100) may include features to facilitate interaction with the wafer (100) carrier. As will be understood by one of skill in the art, the engineering tradeoffs on this point are dependent upon the implementers existing processes and equipment. The decision to include or not to include such features reflects the incremental fixturing advantages vs. the incompatibility with existing equipment which is be made on a case by case basis. The ability to use the composite wafer (100) with existing equipment and processes is a significant advantage that allows economical implementation of composite wafers for lower cost production. If the projected cost savings are consumed with redesign and retrofitting, much of the economic advantage may be lost.

Figure 5A:
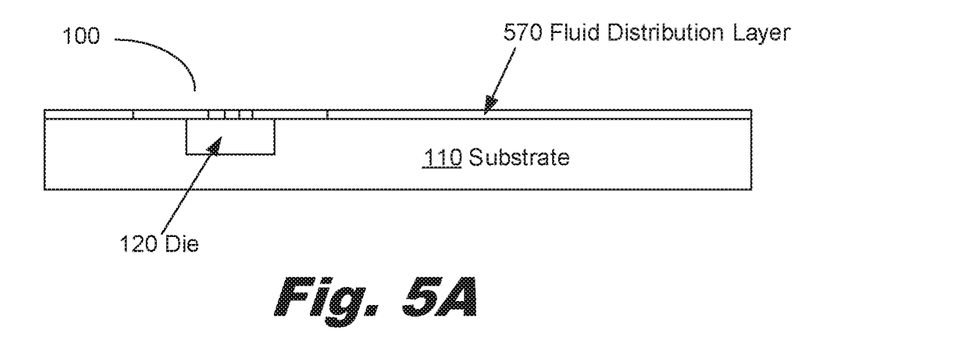
FIG. 5A shows a profile view of a wafer according to one example consistent with the present disclosure.
Figure 5B:
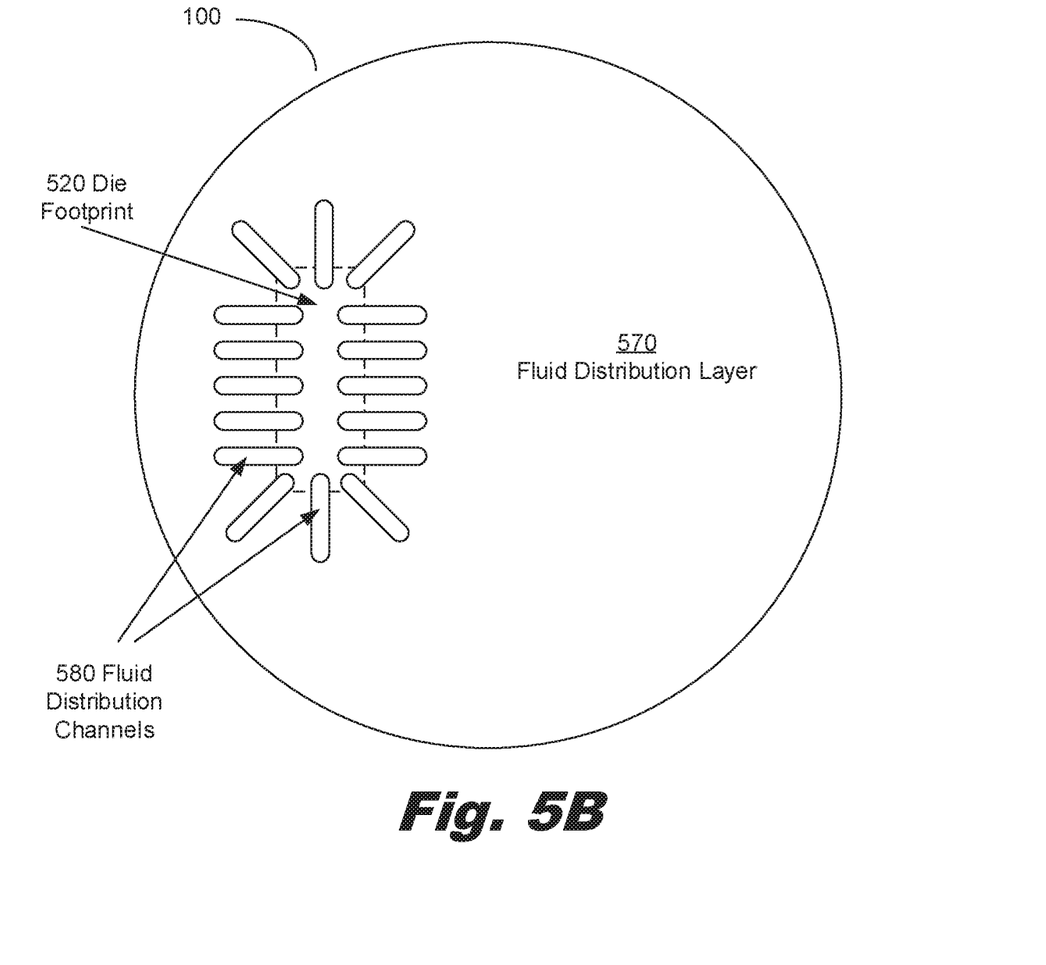
FIG. 5B shows a plan view of the same wafer.

FIG. 5A shows a profile view of a wafer (100) according to one example consistent with the present disclosure. The die (120) is visible embedded in the wafer (100). Further, a fluid distribution layer (570) has been applied to cover a top surface of the wafer (100). FIG. 5B shows a plan view of the same wafer (100). The footprint (520) of the die (120) is shown in dashed lines. The fluid distribution layer (570) is on the top of the wafer (100) and fluid distribution channels (580) are shown extending beyond the footprint (520) of the die (120). This has the advantage of reducing the size of the die (120) which reduces costs and provides other benefits as describe above. Fluidic connections as well as electrical connections can fan out from the die (120). In one example, the electrical connections connect with a via through the composite wafer (100).

Within the principles described by this specification, a vast number of variations exist. The examples described are examples, and are not intended to limit the scope, applicability, or construction of the claims.

What is claimed is:

1. A composite wafer, the wafer comprising:
   a first silicon die with a top surface;
   a polymer substrate with a top surface and a bottom surface, the silicon die embedded in the polymer substrate such that the top surface of the substrate and the first top surface of the first silicon die are coplanar and the bottom surface of the polymer substrate is planar; and
   a fluid distribution layer of patterned photosensitive polymer applied over the top surface of the silicon die and the top surface of the polymer substrate, the fluid distribution layer comprising a fluid distribution channel corresponding to patterning of the photosensitive polymer.

2. The wafer of claim 1, wherein the first silicon die comprises a component of a microfluidics device fluidically connected to the fluid distribution channel.

3. The wafer of claim 1, further comprising a second die with a top surface.

4. The wafer of claim 3, wherein the top surface of the second die is coplanar with the top surface of the first silicon die.

5. The wafer of claim 3, wherein the top surface of the second die is coplanar with the bottom surface of the polymer substrate.

6. The wafer of claim 3, further comprising an electrical connection between the first silicon die and the second die through the polymer substrate.

7. A composite wafer comprising:
   a first silicon die with a top surface;
   a polymer substrate with a top surface and a bottom surface, the silicon die embedded in the polymer substrate such that the top surface of the substrate and the first top surface of the first silicon die are coplanar and the bottom surface of the polymer substrate is planar; and
   a second silicon die,
   wherein the first silicon die and the second die have different thicknesses.

8. A method of forming a composite die, the method comprising:
   applying a tape to a first surface of a silicon die;
   forming a polymer substrate around the silicon die, the polymer substrate have a first surface coplanar with the first surface of the silicon die;
   removing the tape from the first surface of the silicon die;
   depositing a fluid distribution layer of radiation sensitive polymer on the first surface of the polymer substrate and the first surface of the silicon die; and
   patterning a fluid distribution channel within the fluid distribution layer.

9. The method of claim 8, wherein forming the polymer substrate comprises compression molding the polymer substrate around the silicon die.

10. The method of claim 8, wherein forming the polymer substrate comprises casting the polymer substrate around the silicon die.

11. The method of claim 8, wherein the fluid distribution channel is fluidically connected to the silicon die.

12. A composite wafer for fabricating devices, the wafer comprising:
    a first silicon die comprising a component of a microfluidics device;
    a second silicon die comprising an integrated circuit; and
    a polymer packaging with a flat bottom surface, wherein the first silicon die, second silicon die, and the polymer package form a coplanar top surface.

13. The wafer of claim 12, wherein further comprising an electrical connection between the integrated circuit and the component of the microfluidics device.

* * * * *